United States Patent [19]

Bright et al.

[11] 4,134,029

[45] Jan. 9, 1979

[54] ANALOG SIGNAL DELAY SYSTEM AND METHOD

[75] Inventors: James A. Bright, Denver; Gene H. Clark, Englewood, both of Colo.

[73] Assignee: Hathaway Instruments, Inc., Denver, Colo.

[21] Appl. No.: 792,219

[22] Filed: Apr. 29, 1977

[51] Int. Cl.² .................... G11C 27/02; H03K 5/13
[52] U.S. Cl. .................... 307/293; 307/221 D; 307/353; 328/155; 328/151
[58] Field of Search .................... 307/221 D, 293, 353; 328/155, 151

[56] References Cited

U.S. PATENT DOCUMENTS

| | | | |
|---|---|---|---|
| 3,474,260 | 10/1969 | Frohbach | 307/221 D |
| 3,819,953 | 6/1974 | Puckette et al. | 307/221 D |
| 3,868,516 | 2/1975 | Buss | 307/221 D |
| 3,991,322 | 11/1976 | Bush et al. | 307/221 D |
| 3,999,171 | 12/1976 | Parsons | 307/221 D |

*Primary Examiner*—John S. Heyman
*Attorney, Agent, or Firm*—Wm. Griffith Edwards

[57] ABSTRACT

An analog signal delay system is provided with a bucket-brigade charge transfer device controlled by a clock which supplies pulses at a predetermined frequency to sample an analog signal at its input and to effect a predetermined delay between the signal at the input and the corresponding signal at the output. Analog signals are impressed on the input of the system and are sampled at a pulse rate which may be one-half the frequency of the clock pulses. Periodic calibration or correction pulses are supplied to the brigade device during the intervals between the sampling pulses of the analog signal. One or more amplifiers are provided between the output of the brigade device and the output of the system. In order to correct for D.C. drift errors and gain variations which may result from temperature changes, the correction pulses are compared to a reference to generate error signals which are fed to control circuits to correct the D.C. level and gain. This effects the accurate reproduction of the delayed signals in the conformation of the corresponding input signals. The correction pulses are removed from the signal output of the system by gating techniques into an output capacitor.

17 Claims, 9 Drawing Figures

ANALOG SIGNAL DELAY SYSTEM AND METHOD

This invention relates to signal delay systems and particularly to an improved signal delay system for use in the electric power industry for the recording of waveforms existing upon the occurrence of faults in electric power generating and distributing systems.

In the power generating industry it is essential that the service be maintained at all times and that interruptions be kept to a minimum. When a fault occurs it is desirable to observe the resulting fault wave-forms, and verify the performance of the system and equipment. Continuous operation of the recording equipment would make it possible to record the fault wave-form in its entirety; however, the operating costs and the wear of the equipment make continuous operation prohibitive. Starting the operation upon occurrence of a fault would be effective, however, the starting of recording equipment is not instantaneous and an initial portion of the fault wave-form is lost. Continuous delay of the analog signals monitored by the fault recording equipment provides a practical solution to the above problems of fault recording and makes it possible to record the wave-form of the entire fault sequence. In order to capture the entire fault waveform, it is necessary that the amount of delay time be equal to or greater than the response or start-up time of the fault sensing and recording equipment. If the delay time is greater than the response time, a portion of the monitored wave-form is obtained prior to the fault and may provide useful information as to the cause of the fault.

Various arrangements for effecting a time delay of the monitored wave-form have been devised and used. These arrangements include the use of conventional delay lines consisting of discrete capacitors and inductors, the use of magnetic drum storage units, and the use of digital shift registers. While these arrangements have increased the effectiveness of the fault recording equipment, they have not been found entirely satisfactory for all applications and the success of these systems has been limited for various reasons including complication of the equipment and cost.

An analog signal delay line known as the bucket-brigade circuit is a step by step energy transfer device which has been found useful and effective for introducing delay times into audio equipment. This circuit provides the advantage of infinite resolution and low cost; however, its characteristics and especially its temperature characteristics are such that it does not lend itself to laboratory grade instrumentation.

Accordingly, it is an object of the present invention to provide an analog signal delay system for fault recording equipment including an improved arrangement for utilizing a bucket-brigade circuit for providing a precise delayed analog signal output.

It is another object of this invention to provide an analog signal delay system for power system fault detecting instruments and the like including an improved arrangement for maintaining stable operation regardless of temperature changes.

It is another object of this invention to provide an analog signal delay system utilizing a bucket-brigade energy transfer device and including an improved arrangement for providing very high fidelity of the output signals.

Briefly, in carrying out the objects of this invention in one embodiment thereof, an analog signal delay system is built using a delay line of the bucket-brigade type and providing one or more operational amplifiers in cascade between the output of the delay line and the output of the system. Separate control circuits are provided between the output of the last amplifier and the inputs of respective ones of the amplifiers. The delay line is controlled by a clock and the control circuits are controlled by periodically operated switches which apply data pulses to the delay line input and between each pulse supply a calibrating or correcting signal to the delay line and activate one of the control circuits; capacitors are utilized to maintain the correction signals at the amplifier inputs between correction pulses. The operation of the switches is controlled in synchronism with the clock signals in a predetermined manner and the input and output switches are actuated concurrently for each successive signal sampling operation. The correcting signals may, for example, be either zero correction or gain control signals or both.

The features of novelty which characterize this invention are set forth with particularity in the claims annexed to and forming a part of this specification. The invention itself, however, both as to its organization and method of operation, together with further objects and advantages thereof, will best be understood from the following description taken in connection with the accompanying drawings, in which:

Figure 1:
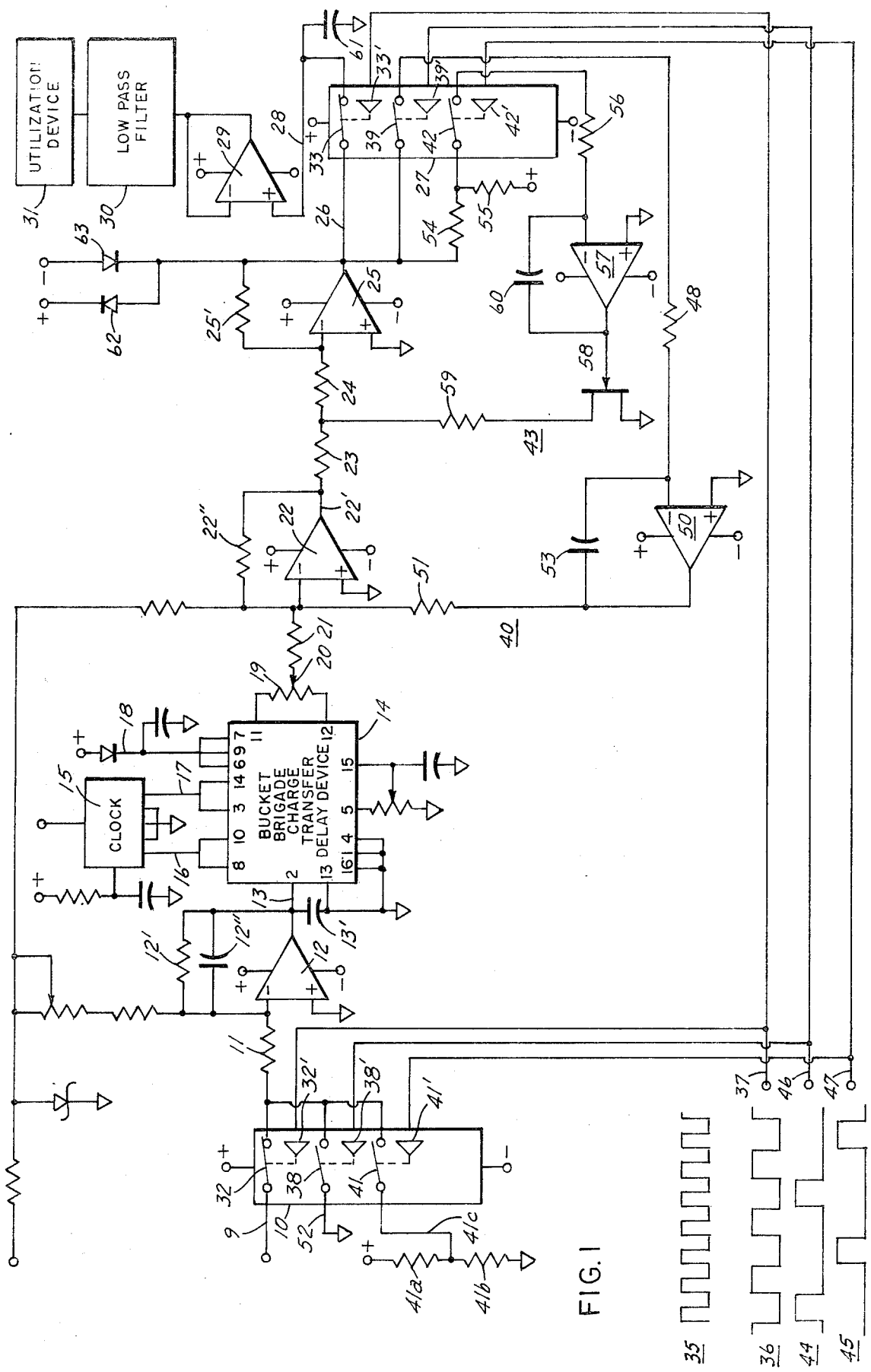
FIG. 1 is a schematic diagram of a circuit embodying the invention.
Figure 2:
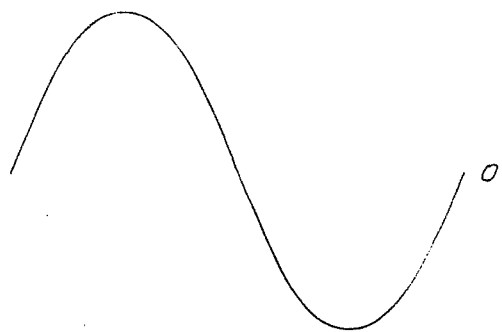
FIGS. 2 through 7 are signal characteristic waveforms existing at selected points of the circuit of FIG. 1.

Referring now to the drawing, the time delay circuit of FIG. 1 is arranged to receive analog signals through an input connection 9 and a switching device 10, the signals then being supplied through resistance 11 to an inverting operational amplifier 12 having a resistance 12' and a capacitor 12" connected in parallel between its input and its output. The output is connected by a lead 13 which supplies the analog signals to the input of a time delay device 14 of the bucket-brigade charge transfer type. The device input is shunted by a capacitor 13'. The amplifier 12 provides a D.C. offset at lead 13 as required to bias the input of the bucket-brigade device 14.

The numerals located around the inner periphery of the rectangle designating the device 14 correspond to the numbers of the pins or terminals of a bucket-brigade device identified in the example of an embodiment of the invention which is given below. Each numeral is adjacent its respective connection on the circuit diagram. The device 14 is clocked by binary square wave pulses received from a device 15 which supplies opposite (complementary) phase clock pulses through input leads 16 and 17, respectively. A regulated supply voltage is connected to the device 14 through a lead 18. The output signal is picked off by an adjustable tap 20 on a resistance 19, and is supplied through a resistance 21 to an inverting operational amplifier 22 which provides a D.C. level shift to restore the D.C. level to zero volts at its output lead, indicated at 22'. A resistance 22" is connected between the output lead 22' and the input of the amplifier 22, and the lead 22' is connected through resistances 23 and 24 in series to the input of a second operational amplifier 25. The signal is thus fed to the amplifier 25 where it is amplified and supplied to a line 26 and through a switching device 27 and a line 28 to a unity gain buffer amplifier 29; the delayed analog signal from this amplifier is delivered through a low pass filter 30 to a utilization device 31. The utilization device may, for example, be a recording oscillograph.

The switching devices 10 and 27 are semiconductor circuits each comprising a plurality of independent switching or gating sections, each illustrated as a single pole switch representing the function and a triangle representing the control circuitry.

During the operation of the system, the time delay device 14 samples the analog signal at its input at a pulse rate determined by the clock 15 which may, for example, produce a 10 KHz pulse rate, and the pulsed samples are advanced through the device step by step at this rate. The top section of the switching device 10, indicated as a switch 32 and circuit 32', is operated at a frequency of one-half that of the clock pulses and closes its switch 32 periodically at this rate to sample the analog signal from the line 9 and supplies the signal in pulses to the delay device 14. The top section of the switching device 27 comprising switch 33 and circuit 33' is operated at the same rate and in synchronism with the top section of the device 10 and closes its switch periodically in synchronism with the operation of the switch 32 of the device 10. The output of the delay system is supplied to the oscillograph or other utilization device 31 which thus records the signals delayed by the time delay of the device 14. A disturbance which occurs at the input 9 thus appears at the oscillograph after the delay period, and it becomes possible to examine the characteristics of the disturbance of the waveform which occurred before the activation of the fault recording equipment. The bucket-brigade delay device have been found highly effective for obtaining various sound effects in audio systems. It may, however, be subject to direct current drift and gain variations which, for example, may result from temperature changes. In order to render the bucket-brigade device effective for precision or laboratory circuitry uses, a correction arrangement has been provided to correct variations either in the zero reference level or the D.C. input level.

In FIG. 1 the square wave clock signal appearing on the lead 16 is indicated at 35 and the square wave control for the switches 32 and 33 is indicated at 36, this wave being in synchronism with the wave 35 directly above it. The control wave-form is impressed on the control circuits 32' and 33' which are connected to the control wave supply line indicated at 37. The switches 32 and 33 are closed simultaneously by the positive pulses of the wave 36 and are so indicated on the drawing; thus the analog input signal is sampled once in each two cycles of the clock. During the negative pulses of the sampling wave-form, calibrating pulses are introduced; the calibrating pulses are alternately a zero reference pulse and a D.C. level pulse.

The zero reference pulse is applied through amplifier 12 to the input of device 14 by closing an intermediate switch 38 of the switching device 10 and at the same time the output of the device 14 is sampled by closing a corresponding intermediate switch 39 of the device 27. The closing of the switch 39 connects a control circuit, generally designated as 40, between the output of the amplifier 25 and the input of the amplifier 22. The operation of this circuit is disclosed below.

The D.C. reference level is set by a voltage divider consisting of resistances 41a and 41b, the junction 41c between the resistances being connected to the switch 41. The D.C. level pulse is applied to the input of the device 14 by closing the bottom switch 41 of the device 10 and simultaneously the bottom switch 42 of the switching device 27. The closing of the switch 42 connects a control circuit, generally designated as 43, between the output of the amplifier 25 and the junction of resistances 23 and 24. The operation of this circuit is described below.

The timed square wave pulses for actuating the switches 38 and 41 are indicated at 44 and 45, respectively, these pulses being applied to the control leads and hence to the control circuits 38' and 41', respectively. The positive pulses 44 and 45 appear alternately and cause the ground (zero) connection 52 and D.C. level junction 41c to be sampled at the input of device 14 during alternate negative going pulses of the wave 36. The control circuits thus supply corrective zero and D.C. level information to the output circuit of the bucket-brigade device 14. In the manner described below the alternating calibrating signals are maintained at the respective points in the output circuit of the device 14 during the sampling periods between the calibrating signals.

It is desirable to minimize noise and switching transients which may be present in the output wave-form of the system. Certain such transients may be generated in the event that the wave-forms on any of the control lines 37, 46 and 47 are at a high level at the same time. In order to minimize these transients, the positive pulses of the wave-forms 36, 44 and 45 are delayed slightly thereby providing dead zones during which none of the control pulses are at a high level. The delay may, for example, be of the order of six microseconds when the data control pulses are supplied at a frequency of 5KHz. Thus, in FIG. 1, the positive pulses of the wave-form 36 have been illustrated as slightly delayed and in a similar manner the positive pulse of the wave-forms 44 and 45 have been illustrated as similarly delayed; the delay has been exaggerated for purposes of illustration. These delay times are clearly indicated at 36', 44' and 45' on the corresponding enlarged curves of FIG. 8.

The control circuits 40 and 43 perform the function of generating correction signals for application to the delayed output signal samples. Thus any correction of the output signals is made on signals which have been delayed by the device 14.

The zero correction control circuit 40 extends from the output of the amplifier 25 through the switch 39, a resistance 48, an inverting amplifier 50, shunted by a capacitor 53, and a resistance 51 to the input of the amplifier 22. The amplifier 50, resistance 48 and capacitor 53 as connected constitute an integrator. The zero reference signal is supplied through the switch 38 from a grounded connection 52 through the amplifier 12 to the input of the delay device 14.

During the operation of the signal delay system, should a zero reference sample be unaffected by passage through the delay device 14 the output of amplifier 25 and of the integrator will be at zero reference. Should the sample signal at the output of device not be at zero reference voltage, the integrator will integrate toward a level equal to the error voltage but of opposite polarity to the error voltage. The integrator thus feeds a zero connection level to the amplifier 22 through the resistance 51; this correction will raise or lower the output voltage of the amplifier 25. When the switch 39 is opened the corrective voltage at the output of the integrator is maintained by the capacitor 53 until the control circuit again becomes active upon the next closing of the switch 39; the voltage of the integrator thus provides either positive or negative current for correcting variations in the zero reference sample at the output of the delay device 14.

The D.C. level or gain correction control circuit 43, closed on operation of the switch 42, extends from the output of amplifier 25 through a resistance 54 of a divider including a resistance 55 connected to a positive voltage source, the switch 42, a resistance 56, an inverting amplifier 57, a junction field effect transistor 58, and a resistance 59 to the junction between resistances 23 and 24 and through resistance 24 to amplifier 25. The amplifier 57, resistance 56 and capacitor 60 connected around the amplifier constitute an integrator. When the sample of the D.C. level reference at the output of the delay device 14 has been unaffected by passage through that device, the voltage at the junction of resistances 54 and 55 will be zero and no correction will be required; in this case the field effect transistor 58 which acts as a voltage controlled variable resistance element will act with the integrator to maintain the D.C. level at the junction of resistances 23 and 24, accordingly. Should the D.C. level of the output of the device 14 vary from that of the input sample, then the integrator will integrate toward a level opposite in polarity to that at the junction of resistances 54 and 55. This correcting signal when applied to the transistor 58 will change the equivalent resistance of the transistor and will thereby adjust the control circuit to shift the voltage at the junction of resistances 54 and 55 back to zero. When the switch 42 opens, the corrected D.C. level value will be maintained by the charge on the capacitor 60. This charge will be maintained until the next closing of the switch 42.

The analog wave-form appearing at the output of the switching device 27 consists of pulses of the analog data samples with plateaus between the analog data samples representing the times during which the calibrating signals are generated. Conditioning of the output signals is, therefore, required in order to reconstruct the original analog signal wave-form. The output signals are supplied to a unity gain buffer amplifier 29 and then to a low pass filter 30 which reproduces the original analog signal while rejecting signal components generated by the signal sampling process. A capacitor 61 connected across the output of the amplifier 25 at the input of the buffer amplifier maintains the signal level during the periods when the switch 33 is open, the high input impedance of the buffer amplifier 29 preventing discharge of the capacitor during the periods when the switch is open.

Figure 5:
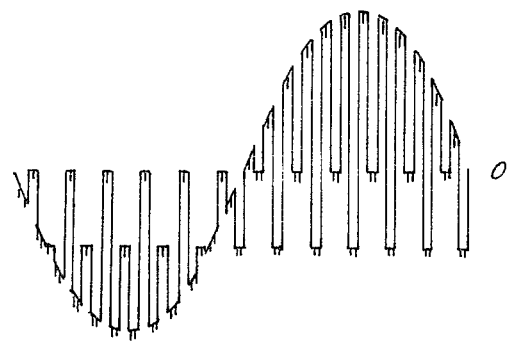
Figure 3:
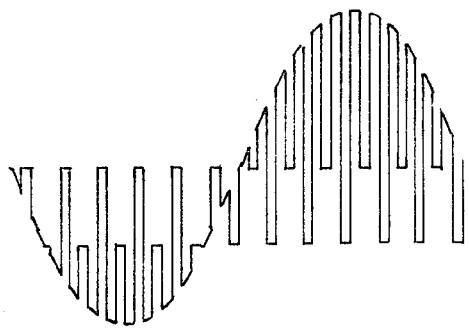
Figure 6:
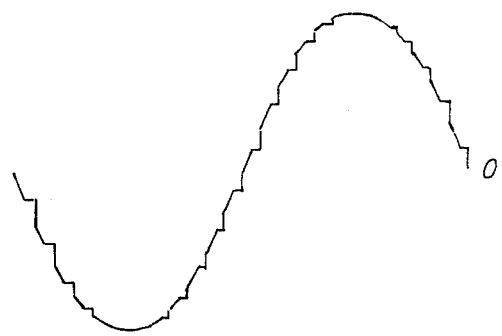
Figure 4:
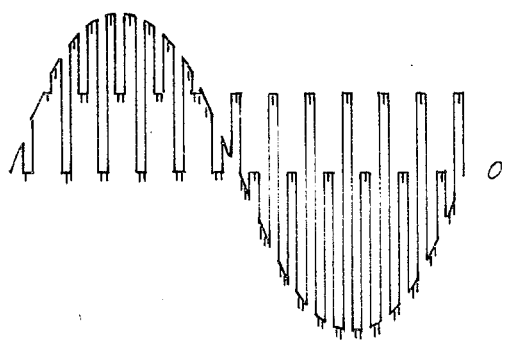
Figure 7:
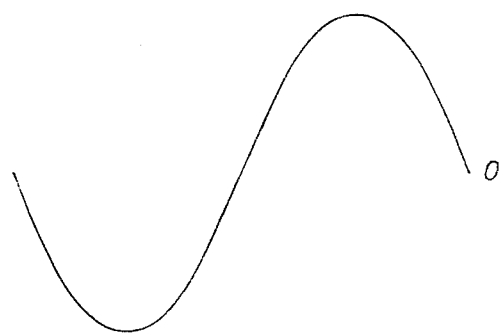

FIGS. 2 through 7 are presented herewith in order to illustrate the wave-forms existing at selected points during the passage of an analog signal through the delay system of the present invention. For purposes of illustration, the analog signal at the input device has been shown in FIG. 2 as a sine wave, for example, the 60Hz wave of an electric power distribution system. The wave of FIG. 2 when sampled by the switch device 10 and appearing at the output of amplifier 12 is shown in FIG. 3, the signal having been inverted by the amplifier and being entirely above the zero reference potential; this figure shows the spaces between sample pulses during which calibrating signals are generated. FIG. 4 shows the delayed and again inverted wave-form appearing at the output of the amplifier 22 with the zero reference restored, this wave-form also shows the slight transients due to the double frequency of the clock pulses which actuate the delay device 14. FIG. 5 shows the signal wave-form at the output of amplifier 25 and which is the wave-form of FIG. 4 again inverted and changed in amplitude; FIG. 6 shows the wave-form appearing at the output of the buffer amplifier 29; this illustrates the level holding or plateau periods between analog samples when the capacitor maintains the attained voltage. FIG. 7 illustrates the waveform at the output of the filter 30, this being an accurate reproduction of the input sine wave.

Figure 8:
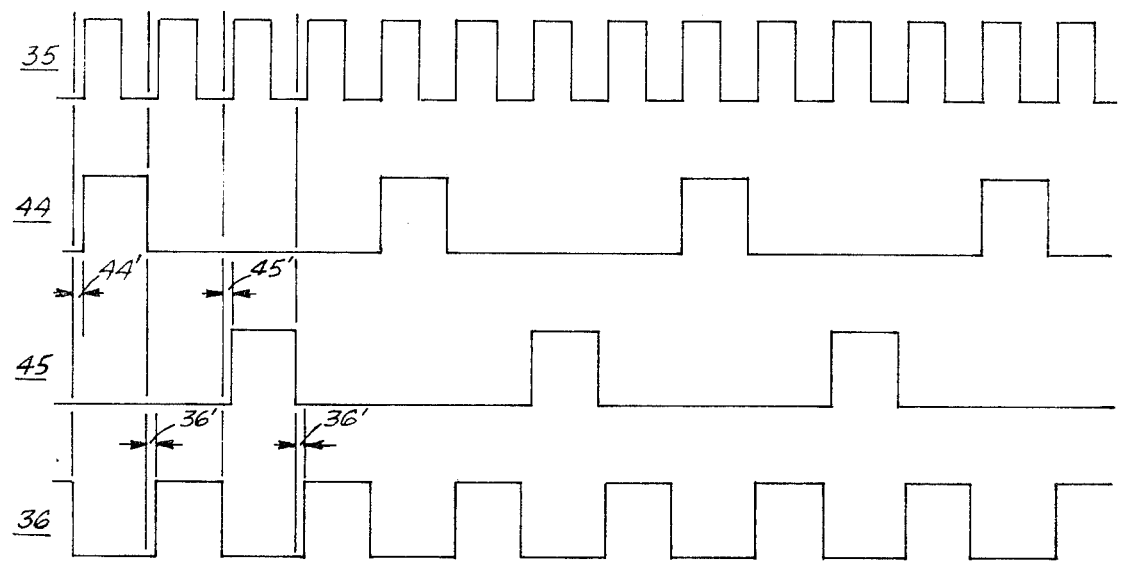
FIG. 8 is an enlarged illustration of a set of curves indicated in FIG. 1.
Figure 9:
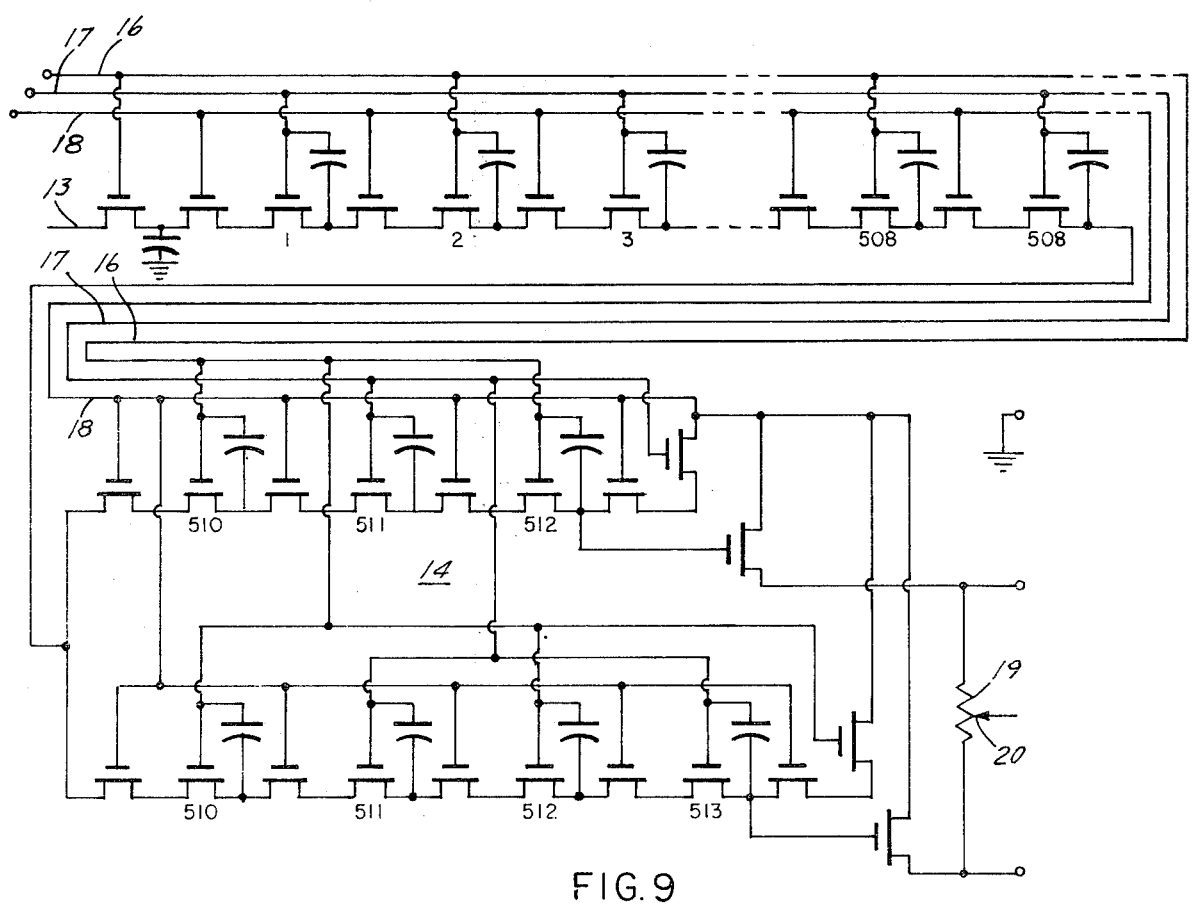
FIG. 9 is an equivalent circuit diagram of a signal delay bucket-brigade device of the type suitable to be employed in the circuit of FIG. 1.

By way of example, and not by way of limitation, in one delay system embodying the invention, a bucket-brigade time delay device produced and sold by Reticon Corporation of Sunnyvale, Calif., and designated SAD1024A, Dual 512 Stage Analog Delay Line, was employed as the delay device 14. An equivalent circuit diagram of one section of this device is shown in FIG. 9, the successive stages from 1 to 513 being indicated by numerals in the diagram. The device was clocked at a rate of 10KHz by a Binary Square Wave Generator — the two 180° complementary phases of the clock output were connected to drive the bucket-brigade device and were delivered by the output leads 16 and 17, respectively, shown also as the input leads to the device 14 as illustrated by FIG. 8; outputs 11 and 12 were connected across resistance 19. The clock 15 was a type CD4013B Binary Square Wave Generator supplied by RCA Solid State Division of Somerville, N.J.

The switching devices 10 and 27 were CMOS Type CD4016B manufactured and sold by RCA, Solid State Division, of Somerville, N.J.

Amplifiers 12 and 29 were Type LM741CN operational amplifiers supplied by National Semiconductor Corporation of Santa Clara, Calif.

Amplifiers 22, 25, 50 and 57 were Type LF356H operational amplifiers supplied by National Semiconductor Company.

The field effect transistor 58 was a Type TIS75 supplied by Texas Instruments Inc. of Dallas, Tex.

The resistances and capacitors had the following values:

11: 1 megohm
12': 150 kilohms
19: 2 kilohms
21: 56 kilohms
22'': 270 kilohms
23: 51 kilohms
24: 1.2 kilohms
25': 150 kilohms
48: 22 kilohms
51: 270 kilohms
54: 3.01 kilohms
55: 35.7 kilohms
56: 22 kilohms
59: 470 ohms
12'': 33 picofarads
13': 0.10 microfarad
53: 0.047 microfarad
60: 15 microfarads
61: 0.0047 microfarad The amplifiers 12, 22, 25, 29, 50 and 57 were connected to a regulated voltage supply providing 15 volts positive and 15 volts negative.

A 6.8 volt regulated negative supply was connected through resistance biasing networks to the input terminals of amplifiers 12 and 22.

A 12 volt regulated positive supply was connected to the delay device 14, the clock 15 and the resistance 55 of the voltage divider, and to the voltage divider resistance 41a for the D.C. level reference.

An 8.2 volt positive and 6.2 volt negative supply were connected to the switching devices 10 and 27 and through respective clamping diodes (indicated at 62 and 63 in FIG. 1) to the outlet line 26.

This delay system was employed with a power line fault detecting equipment and was found to provide a precise recording of faults initiated in a time interval starting 56 milliseconds before the activation of the fault detecting equipment.

While this invention has been disclosed in connection with a particular analog signal delay system various modifications and other applications will occur to those skilled in the art. Therefore, it is not desired that the invention be limited to the details illustrated and described and it is intended, by the appended claims, to cover all modifications which fall within the spirit and scope of the invention.

We claimed:

1. An analog signal delay system having an analog signal input and a delayed analog signal output and comprising a bucket-brigade charge transfer device having an input and an output and means for producing a predetermined delay between the input and the output, and means for effecting conformation of the delayed output analog signals of said system with the input analog signals supplied thereto, said conformation means comprising:
    means for supplying an analog signal,
    means for generating a calibration signal,
    means for impressing on said device input periodic pulse samples of the analog signal and of the calibration signal in alternating interleaved relationship, and
    means utilizing the delayed calibration signal at the output of said device for producing a correction signal and for holding the correction signal at the output during the presence of the succeeding delayed analog signal sample regardless of direct current drift during the transfer of the analog signal sample through said device.

2. An analog signal delay system as set forth in claim 1 wherein said calibration signal is a zero reference signal and said means utilizing the delayed calibration signal forces the zero reference signal to true zero at said output.

3. An analog signal delay system as set forth in claim 1 wherein said calibration signal is a D.C. level signal and said means for utilizing the delayed calibration signal pulses includes means providing an automatic gain control of the output analog signal to force the output signal to a predetermined reference level.

4. An analog signal delay system as set forth in claim 1 wherein said calibration signal pulses are alternately a zero reference pulse and a D.C. reference level pulse and wherein said means for utilizing the delayed calibration signal for producing a correction produces alternate zero reference correction pulses and D.C. reference level correction pulses and maintains each respective correction pulse during the next succeeding delayed analog signal pulse.

5. An analog signal delay system as set forth in claim 1 wherein said means utilizing the delayed calibration signal including an integrator.

6. An analog signal delay system as set forth in claim 4 wherein said means utilizing the delayed calibration signal includes respective integrators for producing the zero reference correction pulse and the D.C. reference level correction pulse.

7. An analog signal delay system as set forth in claim 3 wherein said automatic gain control means includes a junction field effect transistor.

8. An analog signal delay system having an analog signal input and a delayed analog signal output and comprising:
    a bucket-brigade charge transfer device having an input and an output,
    a clock connected to supply control pulses to said device for periodically sampling signals at the device input at a predetermined frequency and for effecting a predetermined time delay between a device input signal and a corresponding device output signal,
    circuit means including at least one amplifier for connecting said device output to said delayed analog signal output,
    means for effecting precise conformation of the delayed output analog signals of said system with the corresponding input analog signals supplied thereto,
    said precise signal conformation means comprising:
    means for supplying calibration signals to said system,
    a first switching member for supplying to said device input a sample of the analog input signal and a calibration signal in alternating sequence,
    a second switching member actuated in synchronism with said first switching member for connecting the output of said circuit means in alternating sequence to said delayed analog signal output and to a calibrating signal feedback circuit connected between the output of said circuit means and the input of said one amplifier, and
    means for operating said switching members in a predetermined synchronized relationship with said clock sampling frequency.

9. An analog signal delay system as set forth in claim 8 wherein said calibration signal is alternately and in succession a zero correction signal and a gain correction signal.

10. An analog signal delay system as set forth in claim 8 wherein said calibrating signal correction circuit includes an inverting integrator.

11. An analog signal delay system as set forth in claim 8 wherein said calibration signal is a gain correction signal and said correction circuit includes an inverting integrator and a voltage controlled variable resistance element connected between the output of said integrator and the input of said amplifier and responsive to the output voltage of said integrator.

12. An analog signal delay system as set forth in claim 8 wherein said means for operating said switching members provides a square wave control signal at one-half the frequency of said clock for controlling the sampling of said analog signals and square wave control signals of opposite phase for controlling the supplying of said calibrating signal.

13. An analog signal delay system as set forth in claim 12 including means providing separate square wave control signals for said zero correction signal and said gain correction signal, and wherein the control pulse of said separate wave signals occurs alternately.

14. An analog signal delay system as set forth in claim 13 wherein the positive pulses of said square wave control signals are delayed slightly to provide dead zones during which none of the control pulses are at high level whereby transients are minimized.

15. In an analog signal delay system including a bucket-brigade charge transfer device for producing a predetermined delay of an analog signal transferred from the input to the output of the device, the method for maintaining accurate conformation of the output analog signal of the system to the input signal which comprises:
providing a continuous analog signal,
providing a calibration signal,
periodically sampling the analog signal at a predetermined rate and impressing the sampled analog signals on the input of the delay device,
periodically sampling the calibration signal at said predetermined rate and impressing the sampled calibration signals on the input of the delay device alternately with and in interleaved relationship to the sampled analog signals,
utilizing each delayed calibration signal for generating a correction signal, and
holding the correction signal at the output of the delay device during the presence of the next succeeding analog sample signal.

16. In an analog signal delay system of the type employing a bucket-brigade charge transfer device having an input and an output and a clock for driving said device, the method for effecting with a predetermined delay the accurate reproduction of the input analog signals which comprises:
providing a continuous analog signal,
sampling the continuous analog signal at a predetermined rate and impressing the sample signals on the input of the bucket-brigade device,
alternately with the impressing of the sample analog signals on the input and at the same rate impressing calibrating signals on the input of the device in interleaved relationship with the sample analog signals,
providing an amplifier for the output signals of the bucket-brigade device and supplying the amplified analog signals to a utilization device in synchronism with the sampling of the input signals,
providing a correction signal path to the input of the amplifier and connecting the output of the amplifier to the path in synchronism with the impressing of the calibrating signals, and
including the step of maintaining the calibrating signal at the input of the amplifier during the period before the next calibrating signal.

17. The method of claim 16 wherein said calibrating signals are alternately zero correction signals and gain control signals.

* * * * *